(12) United States Patent
Kalutarage et al.

(10) Patent No.: US 11,107,674 B2
(45) Date of Patent: Aug. 31, 2021

(54) METHODS FOR DEPOSITING SILICON NITRIDE

(71) Applicant: Applied Materials, Inc., Santa Clara, CA (US)

(72) Inventors: Lakmal C. Kalutarage, San Jose, CA (US); Mark J. Saly, Santa Clara, CA (US); Praket Prakash Jha, San Jose, CA (US); Jingmei Liang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/680,289

(22) Filed: Nov. 11, 2019

(65) Prior Publication Data

US 2020/0243323 A1 Jul. 30, 2020

Related U.S. Application Data

(60) Provisional application No. 62/796,277, filed on Jan. 24, 2019.

(51) Int. Cl.
*H01L 21/02* (2006.01)
*H01L 21/768* (2006.01)
(Continued)

(52) U.S. Cl.
CPC ........ *H01L 21/0217* (2013.01); *C23C 16/345* (2013.01); *C23C 16/56* (2013.01);
(Continued)

(58) Field of Classification Search
None
See application file for complete search history.

(56) References Cited

U.S. PATENT DOCUMENTS 7,435,661 B2 10/2008 Miller et al.
7,473,655 B2 1/2009 Wang et al.
(Continued)

FOREIGN PATENT DOCUMENTS

WO 2019010279 A2 1/2019

OTHER PUBLICATIONS

Soldner, M. et al., "Binary Si/N-[4,4]—Spirocycles with Two SiH2SiH2 Loops", Inorganic Chemistry, 1998, vol. 37, No. 3, pp. 510-515 abstract; scheme 2.
(Continued)

*Primary Examiner* — Asok K Sarkar
(74) *Attorney, Agent, or Firm* — Patterson + Sheridan, LLP (57) ABSTRACT

Embodiments described and discussed herein provide methods for depositing silicon nitride materials by vapor deposition, such as by flowable chemical vapor deposition (FCVD), as well as for utilizing new silicon-nitrogen precursors for such deposition processes. The silicon nitride materials are deposited on substrates for gap fill applications, such as filling trenches formed in the substrate surfaces. In one or more embodiments, the method for depositing a silicon nitride film includes introducing one or more silicon-nitrogen precursors and one or more plasma-activated co-reactants into a processing chamber, producing a plasma within the processing chamber, and reacting the silicon-nitrogen precursor and the plasma-activated co-reactant in the plasma to produce a flowable silicon nitride material on a substrate within the processing chamber. The method also includes treating the flowable silicon nitride material to produce a solid silicon nitride material on the substrate.

20 Claims, 1 Drawing Sheet

(51) Int. Cl.
*C23C 16/56* (2006.01)
*C23C 16/34* (2006.01)

(52) U.S. Cl.
CPC .... *H01L 21/0234* (2013.01); *H01L 21/02219* (2013.01); *H01L 21/02274* (2013.01); *H01L 21/02348* (2013.01); *H01L 21/76837* (2013.01)

(56) References Cited

U.S. PATENT DOCUMENTS

| | | | |
|---|---|---|---|
| 7,498,273 B2 | 3/2009 | Mallick et al. | |
| 7,541,297 B2 | 6/2009 | Mallick et al. | |
| 7,601,652 B2 | 10/2009 | Singh et al. | |
| 7,648,927 B2 | 1/2010 | Singh et al. | |
| 7,651,955 B2 | 1/2010 | Ranish et al. | |
| 7,713,346 B2 | 5/2010 | Wang et al. | |
| 7,745,352 B2 | 6/2010 | Mallick et al. | |
| 7,786,320 B2 | 8/2010 | Wang et al. | |
| 7,825,044 B2 | 11/2010 | Mallick et al. | |
| 7,887,883 B2 | 2/2011 | Wang et al. | |
| 7,910,765 B2 | 3/2011 | Wang et al. | |
| 8,153,832 B2 | 4/2012 | Dussarrat | |
| 9,796,739 B2 | 10/2017 | Xiao et al. | |
| 2002/0016084 A1 | 2/2002 | Todd | |
| 2005/0163927 A1 | 7/2005 | McSwiney et al. | |
| 2006/0019032 A1 | 1/2006 | Wang et al. | |
| 2006/0228903 A1 | 10/2006 | McSwiney et al. | |
| 2006/0286774 A1 | 12/2006 | Singh et al. | |
| 2006/0286819 A1 | 12/2006 | Seutter et al. | |
| 2007/0026689 A1 | 2/2007 | Nakata et al. | |
| 2009/0061647 A1* | 3/2009 | Mallick | H01L 21/02337 438/773 |
| 2009/0111284 A1 | 4/2009 | Wang et al. | |
| 2010/0018460 A1 | 1/2010 | Singh et al. | |
| 2010/0081293 A1* | 4/2010 | Mallick | H01L 21/02167 438/794 |
| 2014/0051264 A1 | 2/2014 | Mallick et al. | |
| 2014/0287164 A1 | 9/2014 | Xiao et al. | |
| 2015/0147871 A1 | 5/2015 | Xiao et al. | |
| 2016/0024647 A1 | 1/2016 | Saly et al. | |
| 2017/0114465 A1 | 4/2017 | Kalutarage et al. | |
| 2017/0117144 A1 | 4/2017 | Kalutarage et al. | |
| 2019/0013197 A1 | 1/2019 | Basu et al. | |

OTHER PUBLICATIONS

International Search Report and Written Opinion dated Mar. 6, 2020 for Application No. PCT/US2019/060757.

\* cited by examiner

METHODS FOR DEPOSITING SILICON NITRIDE

CROSS-REFERENCE TO RELATED APPLICATIONS

This application claims benefit to U.S. Appl. No. 62/796,277, filed on Jan. 24, 2019, which is herein incorporated by reference.

BACKGROUND

Field

Present embodiments generally relate to methods of depositing thin films, and more specifically relate to method for depositing silicon nitride materials by vapor deposition.

Description of the Related Art

Deposition of thin films on a substrate surface is an important process in a variety of industries including semiconductor processing, diffusion barrier coatings and dielectrics for magnetic read/write heads. In the semiconductor industry, in particular, miniaturization benefits from a high level control of thin film deposition to produce conformal coatings on high aspect structures. Due to the miniaturization of microelectronic devices, features of these devices are becoming narrower resulting in increasingly hard to deposit films without voids and poor quality films in the trench. One method for deposition of thin films with relative control and conformal deposition is chemical vapor deposition (CVD). The CVD process involves exposing a substrate to one or more precursors, which react to deposit a film onto the substrate. Flowable chemical vapor deposition (FCVD) is a type of CVD that allows for the deposition of flowable films, in particular for gap fill applications.

Flowable films containing silicon nitride are utilized for gap fill applications. Currently, these flowable films are usually generated from a precursor such as trisilylamine (TSA, $(H_3Si)_3N$). TSA has a N/S atomic ratio of about 0.33. This atomic ratio typically preserved in the deposited silicon nitride films formed from TSA. However, it is desired to have a greater N/S atomic ratio for the deposited silicon nitride films. Additional post treatments can be used to increase the nitrogen content in the silicon nitride films, but adds additional time and cost to the manufacturing process. Also, a post treatment has limitations in the penetration depth of the film, which is important for high aspect ratio trenches, and therefore reduces the quality of film uniformity throughout the film.

Therefore, there is a need for deposition methods that utilize chemical precursors that are commercially viable and exhibit both flowable properties as well as contain relatively high N/S atomic ratio (e.g., greater than 0.33).

SUMMARY OF THE INVENTION

Embodiments described and discussed herein provide methods for depositing silicon nitride materials by vapor deposition. The silicon nitride materials are deposited on substrates for gap fill applications, such as filling trenches formed in the substrate surfaces. In one or more embodiments, the method for depositing a silicon nitride film includes introducing one or more silicon-nitrogen precursors and one or more plasma-activated co-reactants into a processing chamber, producing a plasma within the processing chamber, and reacting the silicon-nitrogen precursor and the plasma-activated co-reactant in the plasma to produce a flowable silicon nitride material on a substrate within the processing chamber. The method also includes treating the flowable silicon nitride material to produce a solid silicon nitride material on the substrate. The silicon-nitrogen precursors can have one or more of the following chemical formulas:

or any combination thereof, where each R is independently selected from H, an alkyl, an aryl, an amino, a silyl, an isocyanate, an isothiocyanate, isomers thereof, or salts thereof, or any two R groups are joined to form a cyclic group.

In some embodiments, a method for depositing a silicon nitride film includes exposing a substrate to one or more silicon-nitrogen precursors, one or more plasma-activated co-reactants, and a plasma within a processing chamber to produce a flowable silicon nitride material on the substrate. The method also includes treating the flowable silicon nitride material to produce a solid silicon nitride material on the substrate. The silicon-nitrogen precursors can have one or more of chemical formulas shown above.

In other embodiments, a method for depositing a silicon nitride film includes introducing one or more silicon-nitrogen precursors and one or more plasma-activated co-reactants into a processing chamber and reacting the silicon-nitrogen precursor and the plasma-activated co-reactant with a plasma to produce a flowable silicon nitride material on a substrate within the processing chamber. The method also includes at least partially filling a trench formed in the substrate with the flowable silicon nitride material and treating the flowable silicon nitride material to produce a solid silicon nitride material in the trench. The silicon-nitrogen precursors can have one or more of chemical formulas shown above, but also where each R is independently selected from H, $CH_3$, $C_2H_5$, $C_3H_7$, $C_4H_9$, $NR'_2$, $SiH_x$, $N=C=S$, $N=C=O$, or isomers thereof, or any two R groups are joined to form a cyclic group; each R' is independently selected from H, $CH_3$, $C_2H_5$, $C_3H_7$, $C_4H_9$, or isomers thereof; and x is an integer of 1, 2, or 3.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

It is contemplated that elements and features of one embodiment may be beneficially incorporated in other embodiments without further recitation.

DETAILED DESCRIPTION

Embodiments described and discussed herein provide methods for depositing silicon nitride materials by vapor deposition. The silicon nitride materials are deposited on substrates for gap fill applications, such as filling trenches formed in the substrate surfaces. In one or more embodiments, the method for depositing a silicon nitride film includes introducing one or more silicon-nitrogen precursors and one or more plasma-activated co-reactants into a processing chamber, producing a plasma within the processing chamber, and reacting the silicon-nitrogen precursor and the plasma-activated co-reactant in the plasma to produce a flowable silicon nitride material on a substrate within the processing chamber. The method also includes treating the flowable silicon nitride material to produce a solid silicon nitride material on the substrate.

High quality flowable films can be obtained using one or more of the silicon-nitrogen precursors described and discussed herein in a flowable chemical vapor deposition (FCVD) process. These silicon-nitrogen precursors are used with co-reactants in the form of radicals generated from plasmas. The films have the advantageous effect of low wet etch rate (WER) in diluted hydrofluoric acid (DHF) and low shrinkage rates. The results are particularly surprising for embodiments utilizing silazane compounds as the silicon-nitrogen precursors. Due to the superior characteristics of these films, the films are particularly suitable for gap-fill applications. In particular, the flowability of the films allows filling of the gaps.

In one or more embodiments, the silicon-nitrogen precursor is vaporized to a CVD chamber, and co-reactants (e.g., $NH_3$ only or $NH_3/O_2$) are delivered to the chamber through a remote plasma source (RPS), which will generate plasma active species as the co-reactants. In other embodiments, the plasma can be ignited, generated, or otherwise produced by in-situ plasma, direct plasma, and/or microwave plasma. In some examples, a plasma-activated co-reactant is activated by an RPS, then introduced into the processing chamber and combined with the silicon-nitrogen precursor to produce a plasma within the processing chamber. In other examples, a plasma-activated co-reactant is introduced into the processing chamber in a non-active form, then active within the processing chamber before or while combining with the silicon-nitrogen precursor to produce a plasma within the processing chamber. The plasma-activated co-reactant, or a secondary process gas, can be or include argon, helium, nitrogen ($N_2$), hydrogen ($H_2$), or any combination thereof. Plasma-activated co-reactant molecules or radicals have high energies and react with silicon-nitrogen precursor molecules in the gas phase to form flowable silicon nitride polymers. These flowable silicon nitride polymers deposit on the substrate and have enough flowability so that the flowable silicon nitride polymers will flow through trenches and make a gap-fill. Then the films of the flowable silicon nitride material are subjected to further treatment to produce the solid silicon nitride material. The additional treatment can be or include curing (e.g., $O_3$ and/or UV), a thermal annealing (e.g., steam or $NH_3$), a plasma annealing process, and/or a UV annealing process.

In some embodiments, a direct plasma is used to generate, form, or otherwise produce flowable polymers. A silicon-nitrogen precursor may then be vaporized to a CVD chamber, and co-reactants (e.g., with any combination of $N_2$, $H_2$, Ar, He, $NH_3$, $O_2$, or single co-reactant) are delivered to the chamber while plasma is turned on. In some embodiments, the flowable silicon nitride material is deposited from a direct plasma so that the vaporized silicon-nitrogen precursor is flowed into the processing chamber and the plasma is turned on with or without a co-reactant.

In one or more embodiments, the method for depositing the silicon nitride film includes introducing one or more silicon-nitrogen precursors and one or more plasma-activated co-reactants into the processing chamber, producing a plasma within the processing chamber, and reacting the silicon-nitrogen precursor and the plasma-activated co-reactant in the plasma to produce a flowable silicon nitride material on a substrate within the processing chamber. The method also includes treating the flowable silicon nitride material to produce a solid silicon nitride material on the substrate. In some examples, the substrate surface is exposed to a plasma-activated co-reactant to provide an intermediate film containing a flowable silicon nitride material. Thereafter, the intermediate film can be exposed to UV curing to provide a cured intermediate film and subsequently the cured intermediate film can be annealed to provide a solid film containing silicon nitride material. In one or more embodiments, the method is a FCVD process.

The silicon-nitrogen precursor can be a silazane or other type of compounds that includes a source of silicon and nitrogen. The silicon-nitrogen precursors are vaporized in processing chamber in order to expose to the substrate surface. In one or more embodiments, the silicon-nitrogen precursor is a silazane precursor and is used to deposit or otherwise form films containing silicon and nitrogen.

Unlike the known silicon precursor trisilylamine (TSA, $(H_3Si)_3N$) which has a N/Si atomic ratio of about 0.33, the silicon-nitrogen precursors described and discussed herein provide sources of silicon and nitrogen in much greater ratios than TSA. The silicon-nitrogen precursor has an N/Si atomic ratio of 0.5 or greater, such as greater than 0.5, about 0.6, about 0.67, about 0.75, about 8, about 9, or about 1 to about 1.2, about 1.5, about 2, about 2.5, about 3, about 3.5, about 4, about 5.5, about 5, about 6, about 8, or greater. For example, the silicon-nitrogen precursor has an N/Si atomic ratio of greater than 0.5 to about 8, greater than 0.5 to about 6, greater than 0.5 to about 5, greater than 0.5 to about 4, greater than 0.5 to about 3, greater than 0.5 to about 2, greater than 0.5 to about 1.5, greater than 0.5 to about 1, about 0.67 to about 8, about 0.67 to about 6, about 0.67 to about 5, about 0.67 to about 4, about 0.67 to about 3, about 0.67 to about 2, about 0.67 to about 1.5, about 0.67 to about 1, about 1 to about 8, about 1 to about 6, about 1 to about 5, about 1 to about 4, about 1 to about 3, about 1 to about 2, about 1 to about 1.5, about 2 to about 8, about 2 to about 6, about 2 to about 5, about 2 to about 4, or about 2 to about 3.

The silicon-nitrogen precursors can have one or more of the following chemical formulas:

or any combination thereof, where each R is independently selected from H, an alkyl, an aryl, an amino, a silyl, an isocyanate, an isothiocyanate, isomers thereof, or salts thereof, or any two R groups are joined to form a cyclic group or a bicyclic group. Exemplary alkyl groups can be or include methyl (Me, $CH_3$), ethyl (Et, $C_2H_5$), propyl (Pr, $C_3H_7$), butyl (Bu, $C_4H_9$), pentyl ($C_5H_{11}$), hexyl, heptyl, octyl, nonyl, or greater, or isomers thereof. As used herein, unless otherwise stated, propyl groups can be a normal propyl ($^nPr$) and/or isopropyl ($^iPr$), and butyl groups can be normal butyl ($^nBu$), secondary butyl ($^sBu$), and/or tertiary butyl ($^tBu$).

In some embodiments, each R is independently selected from H, $CH_3$, $C_2H_5$, $C_3H_7$, $C_4H_9$, $NR'_2$, $SiH_x$, N=C=S, N=C=O, or isomers thereof, or any two R groups are joined to form a cyclic group, where x is an integer of 1, 2, or 3. If the R is $NR'_2$, then each R' can independently be selected from H, $CH_3$, $C_2H_5$, $C_3H_7$, $C_4H_9$, or isomers thereof. In some examples, each R can independently be selected from H, $CH_3$, $C_2H_5$, $C_3H_7$, $C_4H_9$, $NR'_2$, or isomers thereof, and each R' is independently selected from H, $CH_3$, $C_2H_5$, $C_3H_7$, $C_4H_9$, or isomers thereof.

In one or more examples, the silicon-nitrogen precursor can have the following chemical formula:

where each R is independently selected from H, $CH_3$, $C_2H_5$, $C_3H_7$ ($^nPr$ and/or $^iPr$), $C_4H_9$ ($^nBu$, $^sBu$, and/or $^tBu$), $NR'_2$, or isomers thereof, and each R' is independently selected from H, $CH_3$, $C_2H_5$, $C_3H_7$, $C_4H_9$, or isomers thereof. For example, the silicon-nitrogen precursor can have one or more of the following chemical formulas:

or any combination thereof.

In one or more examples, the silicon-nitrogen precursor can have the chemical formula:

where each R is independently selected from H, $CH_3$, $C_2H_5$, $C_3H_7$, $C_4H_9$, or isomers thereof. In some examples, each R can independently be $CH_3$, $^nPr$, $^iPr$, or $^tBu$.

In one or more examples, the silicon-nitrogen precursor can have one or more of the following chemical formulas:

or any combination thereof. Each R can independently be selected from H, $CH_3$, $C_2H_5$, $C_3H_7$, $C_4H_9$, phenyl (Ph, $C_6H_5$), aryl (Ar), $CH_2$—Ph, $CH_2$—Ar, substitutes thereof, or isomers thereof.

In some examples, the silicon-nitrogen precursor can have the chemical formula:

where each R is independently selected from $^iPr$, $^tBu$, $CH_2$—Ph, $CH_2$—Ar, substitutes thereof, or isomers thereof.

In other examples, the silicon-nitrogen precursor can have the chemical formula:

where each R is independently selected from $CH_3$, Ar (e.g., Ph), substitutes thereof, or isomers thereof.

In one or more embodiments, the method also includes at least partially filling a trench formed in the substrate with the flowable silicon nitride material and curing the flowable silicon nitride material to produce the solid silicon nitride material in the trench. In other embodiments, the method also includes depositing the flowable silicon nitride material as a layer on the substrate or in the trench, and then treating the layer containing the flowable silicon nitride material to produce a layer containing the solid silicon nitride material. The process of depositing a layer of the flowable silicon nitride material and treating the layer of the flowable silicon nitride material can be repeated to produce a plurality of the layers of the solid silicon nitride material sequentially formed on one another, which makes up the overall silicon nitride film.

Figure 1:
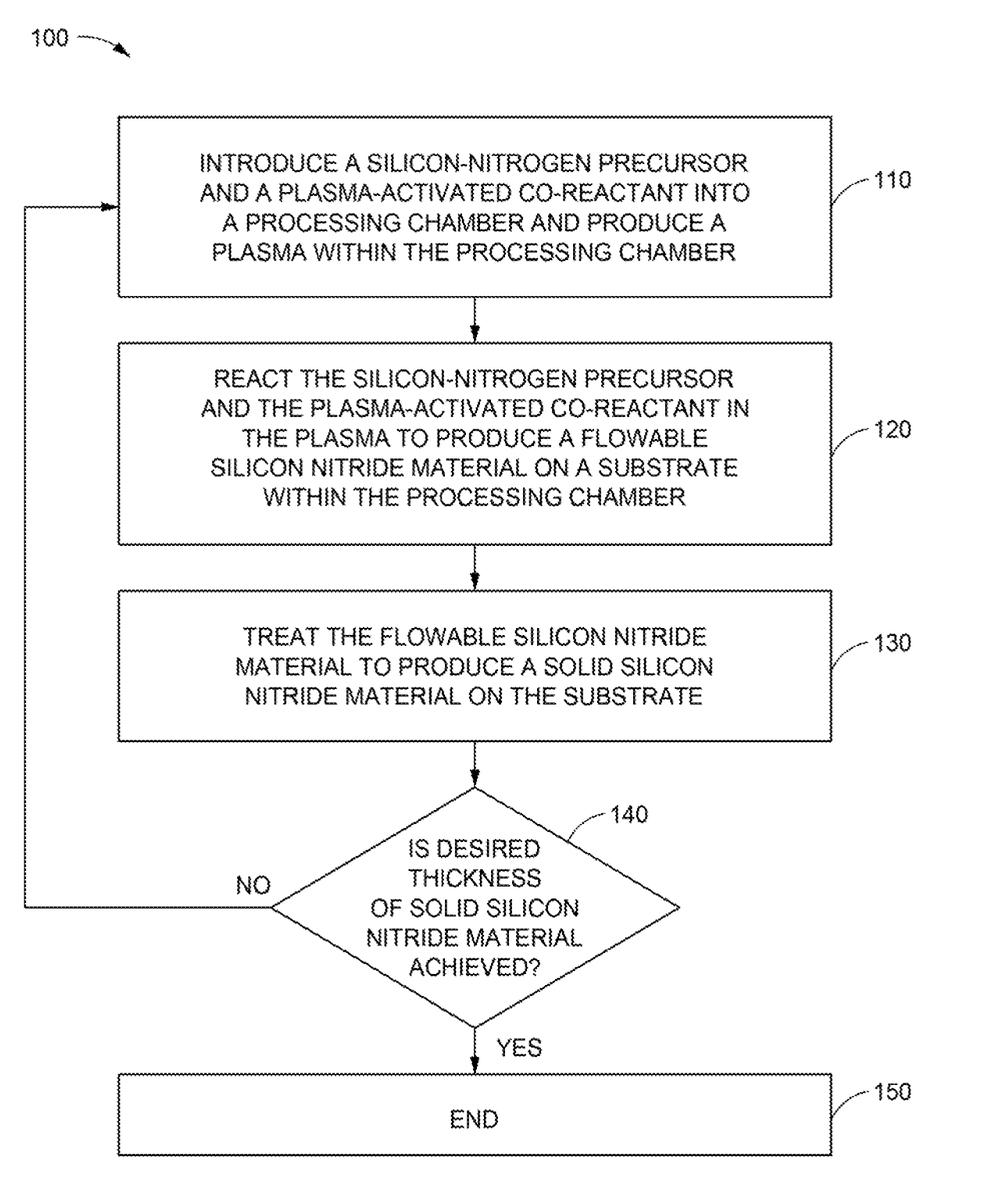
FIG. 1 depicts a flowchart of a method for depositing a silicon nitride film, according to one or more embodiments.

FIG. 1 depicts a flowchart of a method 100 for depositing a silicon nitride film, according to one or more embodiments.

At 110, one or more silicon-nitrogen precursors and one or more plasma-activated co-reactants are introduced or otherwise placed into a processing chamber. A plasma is generated, ignited, activated, formed, and/or otherwise produced within the processing chamber. In some examples, one or more plasma-activated co-reactants are remotely activated such as by an RPS. Once activated, the plasma-activated co-reactant is introduced into the processing chamber and combined with one or more silicon-nitrogen precursors to produce the plasma within the processing chamber. In other examples, one or more plasma-activated co-reactants are introduced into the processing chamber in a non-active or gaseous form. Once in the processing chamber, the plasma-activated co-reactants are active within the processing chamber before and/or while combining with the one or more silicon-nitrogen precursors to produce the plasma within the processing chamber.

At 120, the silicon-nitrogen precursor and the plasma-activated co-reactant react together in the plasma to produce a flowable silicon nitride material deposited or otherwise disposed on the substrate within the processing chamber. The flowable silicon nitride material can deposited or otherwise produced as a layer on the substrate, such as at least partially or completely filing one or more trenches formed on the substrate or films thereof.

At 130, the flowable silicon nitride material is treated by one or more treatment processes to produce a solid silicon nitride material on the substrate.

Each layer of the flowable silicon nitride material and/or each layer of the solid silicon nitride material can independently have a thickness of about 5 Å, about 8 Å, about 10 Å, about 12 Å, about 15 Å, about 18 Å, about 20 Å, about 22 Å, or about 25 Å to about 28 Å, about 30 Å, about 35 Å, about 40 Å, about 45 Å, about 50 Å, or about 60 Å. For example, each layer of the flowable silicon nitride material and/or each layer of the solid silicon nitride material can independently have a thickness of about 5 Å to about 50 Å, about 10 Å to about 50 Å, about 15 Å to about 50 Å, about 20 Å to about 50 Å, about 25 Å to about 50 Å, about 30 Å to about 50 Å, about 35 Å to about 50 Å, about 40 Å to about 50 Å, about 5 Å to about 40 Å, about 10 Å to about 40 Å, about 15 Å to about 40 Å, about 20 Å to about 40 Å, about 25 Å to about 40 Å, about 30 Å to about 40 Å, about 35 Å to about 40 Å, about 5 Å to about 30 Å, about 10 Å to about 30 Å, about 15 Å to about 30 Å, about 20 Å to about 30 Å, or about 25 Å to about 30 Å.

At 140, if the desired thickness of the solid silicon nitride material, such as the overall silicon nitride film, is not achieved, then 110, 120, and 130 are repeated until the desired thickness if achieved. Once the desired thickness of the solid silicon nitride material is achieved, then the method is completed or done and can be stopped at 150.

In one or more embodiments, a process cycle of producing or depositing the flowable silicon nitride material on the substrate, at least partially filling the trench with the flowable silicon nitride material, and the curing the flowable silicon nitride material to produce the solid silicon nitride material in the trench can be sequentially repeated one or multiple times. The silicon nitride film eventually contains a plurality of layers of the solid silicon nitride material sequentially formed on one another. The amount of layers of the solid silicon nitride material is indicative of the amount times the process cycle is conducted, such as once or repeated.

In some embodiments, the process cycle can be performed a single time to completely or partially fill the gap and/or trench, or alternatively, the process cycle is repeated at least 1 time, 2 times, 3 times, 4 times, or 5 times to 6 times, 8 times, 10 times, about 12 times, about 15 times, about 18, about 20 times, or more times. For example, the process cycle is repeated at least 1 time to about 20 times, 2 times to about 20 times, 3 times to about 20 times, 4 times to about 20 times, 5 times to about 20 times, 6 times to about 20 times, 8 times to about 20 times, 10 times to about 20 times, about 15 times to about 20 times, at least 1 time to about 10 times, 2 times to about 10 times, 3 times to about 10 times, 4 times to about 10 times, 5 times to about 10 times, 6 times to about 10 times, 8 times to about 10 times, at least 1 time to 5 times, 2 times to 5 times, 3 times to times, or 4 times to 5 times.

The silicon nitride film containing one, two, or a plurality of layers of the solid silicon nitride material can have a thickness of about 5 Å, about 10 Å, about 15 Å, about 20 Å, about 25 Å, about 30 Å, about 50 Å, about 75 Å, about 80 Å, or about 100 Å to about 120 Å, about 150 Å, about 175 Å, about 200 Å, about 250 Å, about 300 Å, about 400 Å, about 500 Å, about 600 Å, about 800 Å, or thicker. For example, the silicon nitride film containing one or more layers of the solid silicon nitride material can have a thickness of about 10 Å to about 800 Å, about 10 Å to about 500 Å, about 10 Å to about 800 Å, about 10 Å to about 300 Å, about 10 Å to about 250 Å, about 10 Å to about 200 Å, about 10 Å to about 150 Å, about 10 Å to about 100 Å, about 10 Å to about 80 Å, about 10 Å to about 50 Å, about 50 Å to about 800 Å, about 50 Å to about 500 Å, about 50 Å to about 800 Å, about 50 Å to about 300 Å, about 50 Å to about 250 Å, about 50 Å to about 200 Å, about 50 Å to about 150 Å, about 50 Å to about 100 Å, about 50 Å to about 80 Å, about 100 Å to about 800 Å, about 100 Å to about 500 Å, about 100 Å to about 800 Å, about 100 Å to about 300 Å, about 100 Å to about 250 Å, about 100 Å to about 200 Å, about 100 Å to about 150 Å, or about 100 Å to about 120 Å.

As discussed above, the silicon-nitrogen precursor and/or the substrate surface are exposed to one or more plasma-activated co-reactants. In some embodiments, the co-reactants can be or include ammonia ($NH_3$), oxygen ($O_2$), or a combination or mixture of ammonia and oxygen. The co-reactant may also contain one or more of nitrogen ($N_2$), hydrogen ($H_2$), argon, helium, or any combination thereof. The plasma-activated co-reactants will also deliver nitrogen and/or oxygen to the film, depending on the co-reactant used. In some examples, the co-reactant contains a mixture of ammonia and oxygen and in other examples, the co-reactant contains ammonia only.

In some processes, the use of plasma provides sufficient energy to promote a species into the excited state where surface reactions become favorable and likely. The co-reactants are delivered to the CVD chamber containing the vaporized silicon-nitrogen precursor through a remote plasma or a direct plasma, which will generate plasma active species as the co-reactants and produce flowable silicon nitride materials or polymers. Introducing the plasma into the process can be continuous or pulsed. In some embodiments, sequential pulses of precursors (or reactive gases) and plasma are used to process a layer. In some embodiments, the reagents may be ionized either directly (e.g., within the processing area) or remotely (e.g., outside the processing area). In some embodiments, remote ionization can occur upstream of the deposition chamber such that ions or other energetic or light emitting species are not in direct contact with the depositing film containing the silicon nitride material. In some plasma-enhanced processes, the plasma is generated external from the processing chamber, such as by a remote plasma generator or a RPS. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz, and/or 100 MHz.

In some embodiments, the substrate may be exposed to the silicon-nitrogen precursor and the plasma-activated co-reactant continuously simultaneously, or substantially simultaneously, as appropriate. As used herein, the term "substantially simultaneously" means that a majority of the flow of one component overlaps with the flow of another, although there may be some time where they are not co-flowed. In alternative embodiments, contacting the substrate surface with two or more precursors occurs sequentially or substantially sequentially. As used herein, "substantially sequentially" means that a majority of the flow of one component does not coincide with the flow of another, although there may be some overlap.

A "substrate" as used throughout this specification, refers to any substrate or material surface formed on a substrate upon which film processing is performed during a fabrication process. For example, a substrate surface on which processing can be performed includes materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. The substrate may contain node device structures (e.g., 32 nm, 22 nm, or sub-20 nm), and may include transistor isolation, various integrated and sacrificial spacers, and sidewall spacer double patterning (SSDP) lithography. In one or more embodiments, the substrate contains at least one gap. The substrate may have a plurality of gaps for the spacing and structure of device components (e.g., transistors) formed on the substrate. The gaps may have a height and width that define an aspect ratio (AR) of the height to the width (e.g., H/W) that is significantly greater than 1:1 (e.g., 5:1 or greater, 6:1 or greater, 7:1 or greater, 8:1 or greater, 9:1 or greater, 10:1 or greater, 11:1 or greater, 12:1 or greater). In some embodiments, the high AR is due to small gap widths of that range from about 90 nm to about 22 nm or less (e.g., about 90 nm, 65 nm, 45 nm, 32 nm, 22 nm, or 16 nm).

In addition to film processing directly on the surface of the substrate itself, in embodiments described and discussed herein, any of the film processing steps disclosed may also be performed on an underlayer formed on the substrate as disclosed in more detail below, and the term "substrate surface" is intended to include such underlayer as the context indicates.

In one or more embodiments of any of the above-described reactions, the reaction conditions for the deposition reaction will be selected based on the properties of the film precursors and substrate surface. The deposition may be carried out at atmospheric pressure, but may also be carried out at reduced pressure (less than atmospheric pressure). The substrate temperature is maintained to provide sufficient energy for surface reactions or treatments of the chemical precursors (e.g., one or more silicon-nitrogen precursors and/or one or more plasma-activated co-reactants) and/or the flowable silicon nitride material. The specific temperature depends on the specific substrate, film precursors, and pressure. The properties of the specific substrate, chemical precursors, and other attributes may be evaluated using methods known in the art, allowing selection of appropriate temperature and pressure for the reaction. In some embodiments, the pressure within the processing chamber (e.g., vapor deposition chamber) is less than 6 Torr, such as about 5 Torr, about 4 Torr, about 3 Torr, about 2.6 Torr, about 2 Torr, or about 1.6 Torr. In one or more embodiments, the deposition is carried out at a temperature less than about 200° C., such as about 0° C., about 25° C., about 35° C., about 50° C., or about 75° C. to about 100° C., about 125° C., about 150° C., about 175° C., about 190° C., or about 195° C.

The film deposited after the substrate is exposed to the silicon-nitrogen precursor and the plasma-activated co-reactant contains a flowable silicon nitride material (also referred to as the "intermediate film"). In general, the as-deposited films are relatively low dense films with less networks and more dangling bonds such as Si—H, Si—OH, and N—H. As a result, the WER of the intermediate film containing a flowable silicon nitride material usually has a relatively high value. In order to get low WER/dense films, the intermediate film is subjected to further treatments to obtain a high density film. During these treatments remaining reactive bonds (e.g., SiH, NH) react with each other or with incoming molecules (e.g., $O_3$, water, $NH_3$) to form a film with more networks. Thus, in order to remove either oxygen to achieve the targeted film, then the intermediate film is subjected to additional curing and annealing processes.

In one or more embodiments, curing includes exposing the intermediate film containing the flowable silicon nitride material to ozone and/or ultraviolet (UV) radiation. In further embodiments, the intermediate film is exposed to ozone and UV cure to obtain a film containing the solid silicon nitride material. In other embodiments, the intermediate film is exposed only to a UV cure to obtain a film containing the solid silicon nitride material. One or more embodiments also involve an anneal process. In some embodiments, annealing includes steam annealing. In other embodiments, annealing includes ammonia annealing. In one or more examples, the intermediate film containing the flowable silicon nitride material is cured by UV, followed by ammonia anneal to generate or otherwise produce a film containing the solid silicon nitride material.

According to one or more embodiments, the substrate is subjected to processing prior to and/or after forming one or more films containing the solid or the flowable silicon nitride material. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the desired separate processing chamber. Accordingly, the processing apparatus may contain multiple chambers in communication with a transfer station. An apparatus of this sort may be referred to as a "cluster tool" or "clustered system", and the like.

Generally, a cluster tool is a modular system containing multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. In one or more embodiments, a FCVD chamber or system that may be used to perform the methods described and discussed herein is the Producer® Eterna FCVD® system or chamber, commercially available from Applied Materials, Inc., of Santa Clara, Calif. Two cluster tools which may be adapted for embodiments described and discussed herein are the Centura® chamber or system and the Endura® chamber or system, commercially available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), plasma-enhanced-ALD (PE-ALD), chemical vapor deposition (CVD), plasma-enhanced-CVD (PE-CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, or other processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The substrate and chamber may be exposed to a purge step after stopping the flow of the precursor, co-reagent, or other gases or reagents. In one or more embodiments of any of the aspects described herein, a purge gas may be flowed after any of the precursors is flowed/exposed to a substrate surface. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 4 seconds. The carrier gas, the purge gas, the deposition gas, and/or other process gas can be or include nitrogen, hydrogen, argon, neon, helium, or any combination or mixture thereof. In one example, the carrier gas contains nitrogen.

Embodiments of the present disclosure further relate to any one or more of the following paragraphs 1-20:

1. A method for depositing a silicon nitride film, comprising: introducing a silicon-nitrogen precursor and a plasma-activated co-reactant into a processing chamber; producing a plasma within the processing chamber; reacting the silicon-nitrogen precursor and the plasma-activated co-reactant in the plasma to produce a flowable silicon nitride material on a substrate within the processing chamber; and treating the flowable silicon nitride material to produce a solid silicon nitride material on the substrate, wherein the silicon-nitrogen precursor is selected from the group consisting of:

-continued and any combination thereof, wherein each R is independently selected from H, an alkyl, an aryl, an amino, a silyl, an isocyanate, an isothiocyanate, isomers thereof, or salts thereof, or any two R groups are joined to form a cyclic group.

2. A method for depositing a silicon nitride film, comprising: exposing a substrate to a silicon-nitrogen precursor, a plasma-activated co-reactant, and a plasma within a processing chamber to produce a flowable silicon nitride material on the substrate; and treating the flowable silicon nitride material to produce a solid silicon nitride material on the substrate, wherein the silicon-nitrogen precursor is selected from the group consisting of:

and any combination thereof, wherein each R is independently selected from H, an alkyl, an aryl, an amino, a silyl, an isocyanate, an isothiocyanate, isomers thereof, or salts thereof, or any two R groups are joined to form a cyclic group.

3. A method for depositing a silicon nitride film, comprising: introducing a silicon-nitrogen precursor and a plasma-activated co-reactant into a processing chamber; reacting the silicon-nitrogen precursor and the plasma-activated co-reactant with a plasma to produce a flowable silicon nitride material on a substrate within the processing chamber; at least partially filling a trench formed in the substrate with the flowable silicon nitride material; and treating the flowable silicon nitride material to produce a solid silicon nitride material in the trench, wherein the silicon-nitrogen precursor is selected from the group consisting of:

-continued and any combination thereof, wherein: each R is independently selected from H, $CH_3$, $C_2H_5$, $C_3H_7$, $C_4H_9$, $NR'_2$, $SiH_x$, N=C=S, N=C=O, or isomers thereof, or any two R groups are joined to form a cyclic group; each R' is independently selected from H, $CH_3$, $C_2H_5$, $C_3H_7$, $C_4H_9$, or isomers thereof; and x is an integer of 1, 2, or 3.

4. The method according to any one of paragraphs 1-3, wherein: each R is independently selected from H, $CH_3$, $C_2H_5$, $C_3H_7$, $C_4H_9$, $NR'_2$, $SiH_x$, N=C=S, N=C=O, or isomers thereof, or any two R groups are joined to form a cyclic group; each R' is independently selected from H, $CH_3$, $C_2H_5$, $C_3H_7$, $C_4H_9$, or isomers thereof; and x is an integer of 1, 2, or 3.

5. The method according to any one of paragraphs 1-4, wherein the silicon-nitrogen precursor is:

wherein: each R is independently selected from H, $CH_3$, $C_2H_5$, $C_3H_7$, $C_4H_9$, $NR'_2$, or isomers thereof; and each R' is independently selected from H, $CH_3$, $C_2H_5$, $C_3H_7$, $C_4H_9$, or isomers thereof.

6. The method according to any one of paragraphs 1-5, wherein the silicon-nitrogen precursor is:

or any combination thereof.

7. The method according to any one of paragraphs 1-6, wherein the silicon-nitrogen precursor is:

wherein each R is independently selected from H, $CH_3$, $C_2H_5$, $C_3H_7$, $C_4H_9$, $NR'_2$, or isomers thereof; and each R' is independently selected from H, $CH_3$, $C_2H_5$, $C_3H_7$, $C_4H_9$, or isomers thereof.

8. The method according to any one of paragraphs 1-7, wherein each R is independently selected from $CH_3$, $^nPr$, $^iPr$, or $^tBu$.

9. The method according to any one of paragraphs 1-8, wherein the silicon-nitrogen precursor is:

or any combination thereof, wherein each R is independently selected from H, $CH_3$, $C_2H_5$, $C_3H_7$, $C_4H_9$, Ph, $CH_2$—Ph, or isomers thereof.

10. The method according to any one of paragraphs 1-9, wherein the silicon-nitrogen precursor is:

wherein each R is independently selected from $^iPr$, $^tBu$, or $CH_2$—Ph.

11. The method according to any one of paragraphs 1-10, wherein the silicon-nitrogen precursor is:

wherein each R is independently selected from $CH_3$ or Ph.

12. The method according to any one of paragraphs 1-11, wherein the plasma-activated co-reactant comprises ammonia, oxygen ($O_2$), or a combination of ammonia and oxygen.

13. The method according to any one of paragraphs 1-12, wherein the plasma-activated co-reactant further comprises argon, helium, nitrogen ($N_2$), hydrogen ($H_2$), or any combination thereof.

14. The method according to any one of paragraphs 1-13, wherein the silicon-nitrogen precursor has an N/Si atomic ratio of about 0.67 to about 5.

15. The method according to any one of paragraphs 1-14, further comprising: at least partially filling a trench formed in the substrate with the flowable silicon nitride material; and curing the flowable silicon nitride material to produce the solid silicon nitride material in the trench.

16. The method according to any one of paragraphs 1-15, wherein the flowable silicon nitride material has a thickness of about 10 Å to about 500 Å when curing the flowable silicon nitride material to produce the solid silicon nitride material in the trench.

17. The method according to any one of paragraphs 1-16, further comprising sequentially repeating the at least partially filling the trench with the flowable silicon nitride material and the curing the flowable silicon nitride material to produce the solid silicon nitride material in the trench at least 1 time to about 20 times.

18. The method according to any one of paragraphs 1-17, wherein the silicon nitride film comprises a plurality of layers of the solid silicon nitride material sequentially formed on one another, and wherein the silicon nitride film has a thickness of about 50 Å to about 500 Å.

19. The method according to any one of paragraphs 1-18, further comprising: depositing the flowable silicon nitride material as a layer on the substrate; treating the layer comprising the flowable silicon nitride material to produce a layer of the solid silicon nitride material; and repeating the depositing and treating to produce the silicon nitride film comprising a plurality of the layers of the solid silicon nitride material sequentially formed on one another.

20. The method according to any one of paragraphs 1-19, wherein the treating the flowable silicon nitride material to produce the solid silicon nitride material, further comprises exposing the flowable silicon nitride material to a thermal annealing process, a plasma annealing process, or a UV annealing process.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for depositing a silicon nitride film, comprising:
   introducing a silicon-nitrogen precursor and a plasma-activated co-reactant into a processing chamber;
   producing a plasma within the processing chamber;
   reacting the silicon-nitrogen precursor and the plasma-activated co-reactant in the plasma to produce a flowable silicon nitride material on a substrate within the processing chamber; and
   treating the flowable silicon nitride material to produce a solid silicon nitride material on the substrate,
   wherein the silicon-nitrogen precursor is selected from the group consisting of:
   a cyclic aminosilane having a N/Si atomic ratio of greater than 1 and the chemical formula of:

an aminosilane having a N/Si atomic ratio of 4 or greater and the chemical formula of:

and any combination thereof, wherein each R is independently selected from H, an alkyl, an aryl, an amino, a silyl, an isocyanate, an isothiocyanate, isomers thereof, or salts thereof, or any two R groups are joined to form a cyclic group.

2. The method of claim 1, wherein:
each R is independently selected from H, $CH_3$, $C_2H_5$, $C_3H_7$, $C_4H_9$, $NR'_2$, $SiH_x$, N=C=S, N=C=O, or isomers thereof, or any two R groups are joined to form a cyclic group;
each R' is independently selected from H, $CH_3$, $C_2H_5$, $C_3H_7$, $C_4H_9$, or isomers thereof; and
x is an integer of 1, 2, or 3.

3. The method of claim 1, wherein the silicon-nitrogen precursor is:

wherein:
each R is independently selected from H, $CH_3$, $C_2H_5$, $C_3H_7$, $C_4H_9$, $NR'_2$, or isomers thereof; and
each R' is independently selected from H, $CH_3$, $C_2H_5$, $C_3H_7$, $C_4H_9$, or isomers thereof.

4. The method of claim 3, wherein the silicon-nitrogen precursor is:

or
any combination thereof.

5. The method of claim 1, wherein the plasma-activated co-reactant comprises ammonia, oxygen ($O_2$), or a combination of ammonia and oxygen.

6. The method of claim 5, wherein the plasma-activated co-reactant further comprises argon, helium, nitrogen ($N_2$), hydrogen ($H_2$), or any combination thereof.

7. The method of claim 1, wherein the silicon-nitrogen precursor comprises the cyclic aminosilane and has an N/Si atomic ratio of about 1.2 to about 5.

8. The method of claim 1, further comprising:
at least partially filling a trench formed in the substrate with the flowable silicon nitride material; and
curing the flowable silicon nitride material to produce the solid silicon nitride material in the trench.

9. The method of claim 8, wherein the flowable silicon nitride material has a thickness of about 10 Å to about 500 Å when curing the flowable silicon nitride material to produce the solid silicon nitride material in the trench.

10. The method of claim 9, further comprising sequentially repeating the at least partially filling the trench with the flowable silicon nitride material and the curing the flowable silicon nitride material to produce the solid silicon nitride material in the trench at least 1 time to about 20 times.

11. The method of claim 10, wherein the silicon nitride film comprises a plurality of layers of the solid silicon nitride material sequentially formed on one another, and wherein the silicon nitride film has a thickness of about 50 Å to about 500 Å.

12. The method of claim 1, further comprising:
depositing the flowable silicon nitride material as a layer on the substrate;
treating the layer comprising the flowable silicon nitride material to produce a layer of the solid silicon nitride material; and
repeating the depositing and treating to produce the silicon nitride film comprising a plurality of the layers of the solid silicon nitride material sequentially formed on one another.

13. The method of claim 1, wherein the treating the flowable silicon nitride material to produce the solid silicon nitride material, further comprises exposing the flowable silicon nitride material to a thermal annealing process, a plasma annealing process, or a UV annealing process.

14. The method of claim 1, wherein the silicon-nitrogen precursor comprises the cyclic aminosilane and has an N/Si atomic ratio of about 2 to about 4.

15. A method for depositing a silicon nitride film, comprising:
exposing a substrate to a silicon-nitrogen precursor, a plasma-activated co-reactant, and a plasma within a processing chamber to produce a flowable silicon nitride material on the substrate; and
treating the flowable silicon nitride material to produce a solid silicon nitride material on the substrate,
wherein the silicon-nitrogen precursor is selected from the group consisting of:
a cyclic aminosilane having a N/Si atomic ratio of greater than 1 and the chemical formula of:

an aminosilane having a N/Si atomic ratio of 4 or greater and the chemical formula of:

and
any combination thereof, wherein each R is independently selected from H, an alkyl, an aryl, an amino, a silyl, an isocyanate, an isothiocyanate, isomers thereof, or salts thereof, or any two R groups are joined to form a cyclic group.

16. The method of claim 15, wherein the silicon-nitrogen precursor is:

wherein:
each R is independently selected from H, $CH_3$, $C_2H_5$, $C_3H_7$, $C_4H_9$, $NR'_2$, or isomers thereof; and
each R' is independently selected from H, $CH_3$, $C_2H_5$, $C_3H_7$, $C_4H_9$, or isomers thereof.

17. The method of claim 16, wherein the silicon-nitrogen precursor is:

or
any combination thereof.

18. A method for depositing a silicon nitride film, comprising:
introducing a silicon-nitrogen precursor and a plasma-activated co-reactant into a processing chamber;
reacting the silicon-nitrogen precursor and the plasma-activated co-reactant with a plasma to produce a flowable silicon nitride material on a substrate within the processing chamber;
at least partially filling a trench formed in the substrate with the flowable silicon nitride material; and
treating the flowable silicon nitride material to produce a solid silicon nitride material in the trench,
wherein the silicon-nitrogen precursor is selected from the group consisting of:
a cyclic aminosilane having a N/Si atomic ratio of greater than 1 and the chemical formula of:

an aminosilane having a N/Si atomic ratio of 4 or greater and the chemical formula of:

and
any combination thereof, wherein:
each R is independently selected from H, $CH_3$, $C_2H_5$, $C_3H_7$, $C_4H_9$, $NR'_2$, $SiH_x$, N=C=S, N=C=O, or isomers thereof, or any two R groups are joined to form a cyclic group;
each R' is independently selected from H, $CH_3$, $C_2H_5$, $C_3H_7$, $C_4H_9$, or isomers thereof; and
x is an integer of 1, 2, or 3.

19. The method of claim 18, wherein the silicon-nitrogen precursor is:

wherein:
each R is independently selected from H, $CH_3$, $C_2H_5$, $C_3H_7$, $C_4H_9$, $NR'_2$, or isomers thereof; and
each R' is independently selected from H, $CH_3$, $C_2H_5$, $C_3H_7$, $C_4H_9$, or isomers thereof.

20. The method of claim 19, wherein the silicon-nitrogen precursor is:

or
any combination thereof.

* * * * *